US006815225B2

(12) United States Patent
Kim et al.

(10) Patent No.: US 6,815,225 B2
(45) Date of Patent: Nov. 9, 2004

(54) METHOD FOR FORMING CAPACITOR OF NONVOLATILE SEMICONDUCTOR MEMORY DEVICE

(75) Inventors: Nam Kyeong Kim, Kyoungki-do (KR); Ki Seon Park, Kyoungki-do (KR); Dong Su Park, Kyoungki-do (KR); Byoung Kwon Ahn, Seoul (KR); Seung Kyu Han, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/452,494

(22) Filed: Jun. 3, 2003

(65) Prior Publication Data

US 2003/0205744 A1 Nov. 6, 2003

Related U.S. Application Data

(62) Division of application No. 09/880,056, filed on Jun. 14, 2001, now Pat. No. 6,597,029.

(30) Foreign Application Priority Data

Jun. 30, 2000 (KR) ........................................ 2000-36812

(51) Int. Cl.[7] ...................... H01L 21/00; H01L 21/8242
(52) U.S. Cl. ............................ 438/3; 438/253; 438/396
(58) Field of Search ............................ 438/3, 244, 253, 438/387, 396, 957; 257/295, 303, 304, 306, 310, 311, 535

(56) References Cited

U.S. PATENT DOCUMENTS

| 5,874,770 A | 2/1999 | Saia et al. ................... 257/536 |
| 6,130,103 A | 10/2000 | Cuchiro et al. ............. 438/240 |
| 6,365,486 B1 * | 4/2002 | Agarwal et al. ............. 438/393 |
| 6,541,330 B1 * | 4/2003 | Lee et al. ................... 438/240 |
| 6,229,211 B1 | 5/2003 | Kawanoue et al. .......... 257/750 |

* cited by examiner

Primary Examiner—Hung Vu
(74) Attorney, Agent, or Firm—Birch, Stewart, Kolasch & Birch, LLP

(57) ABSTRACT

In the method for forming a capacitor of a nonvolatile semiconductor memory device, a TaON glue layer is formed over a semiconductor substrate, and a lower electrode is formed on the TaON glue layer. A ferroelectric film is then formed on the lower electrode, and an upper electrode is formed on the ferroelectric film.

16 Claims, 4 Drawing Sheets

METHOD FOR FORMING CAPACITOR OF NONVOLATILE SEMICONDUCTOR MEMORY DEVICE

This application is a divisional of co-pending application Ser. No. 09/880,056, filed on Jun. 14, 2001, now U.S Pat. No. 6,597,029 the entire contents of which are hereby incorporated by reference and for which priority is claimed under 35 U.S.C. §120; and this application claims priority of Application No. 2000-36812 filed in KOREA on Jun. 30, 2000 under 35 U.S.C. §119.

BACKGROUND OF THE INVENTION

1. Field of the Invention

The present invention relates to a method for forming a capacitor of a nonvolatile semiconductor memory device that includes a ferroelectric film and the capacitor.

2. Description of the Background Art

A ferroelectric memory device is generally nonvolatile. Accordingly, even when no power is supplied, previously stored data is maintained. In the case that the ferroelectric memory device is sufficiently thin, spontaneous polarization is rapidly inverted, and thus read and write operations can be performed at a high speed such as in a DRAM.

In addition, one transistor and one ferroelectric capacitor can form a one-bit memory cell, thereby obtaining large capacity. $Sr_xBi_{2+y}Ta_2O_9$ (SBT) film and $Sr_xBi_{2+y}(Ta_tNb_{1-t})_2O_9$ (SBTN) film are examples of ferroelectric films used to form the ferroelectric capacitor.

FIG. 1 illustrates a conventional method for forming a capacitor using the SBT or SBTN film as a dielectric film. As shown in FIG. 1, a first interlayer insulation film 12 is deposited on a semiconductor substrate 11 where a node(not shown) has been formed. Thereafter, a glue layer 13 and a conductive layer 14, for a storage electrode, are sequentially formed on the interlayer insulation film 12. Preferably, the glue layer 13 consists of a Ti, TiN or TiOx layer, and the conductive layer 14 for the storage electrode consists of a Pt layer.

An SBT film 15 is deposited on the conductive layer 14. A conductive layer 16 for a plate electrode is deposited on the SBT film 15. Although not illustrated, additional processes are consecutively performed, thereby finishing formation of the capacitor.

This conventional method suffers from several drawbacks. For instance, the Ti of the glue layer 13 is rapidly diffused into the SBT or SBTN film 15 on the lower electrode 14 during a crystallization annealing process carried out in forming the capacitor, thereby deteriorating an electrical property of the capacitor.

In addition, the glue layer 13 is oxidized by oxygen flowing through the lower electrode 14 during the crystallization annealing process, and thus gaps are generated due to an increased volume. Moreover, voids and interface lifting are generated at the lower electrode 14 interface due to the re-crystallization of the lower electrode 14 and the fluidity caused during annealing. As a result, it is more difficult to form the capacitor.

SUMMARY OF THE INVENTION

Accordingly, at least two objects of the present invention are to provide a method for forming a capacitor of a nonvolatile semiconductor memory device which can prevent deterioration of the capacitor and to provide the capacitor.

In order to achieve the above-described object of the present invention, there is provided a method for forming a capacitor of a nonvolatile semiconductor memory device including the steps of: forming a first interlayer insulation film on a semiconductor substrate; forming a TaON film for a glue layer on the first interlayer insulation film; forming a lower electrode on the TaON film; forming an SBT or SBTN film for a ferroelectric film on the lower electrode; and forming an upper electrode on the ferroelectric film. In subsequent processing a second interlayer insulation film having a contact hole for contacting the upper electrode is formed and a metal film to fill up the contact hole is formed.

These and other objects are also achieved by providing a semiconductor device, comprising: a semiconductor substrate; a TaON glue layer formed over the semiconductor substrate; a lower electrode formed on the TaON glue layer; a ferroelectric film formed on the lower electrode; and an upper electrode formed on the ferroelectric film.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for forming a capacitor of a nonvolatile semiconductor memory device in accordance with an embodiment of the present invention will now be described in detail with reference to the accompanying drawings.

Figure 1:
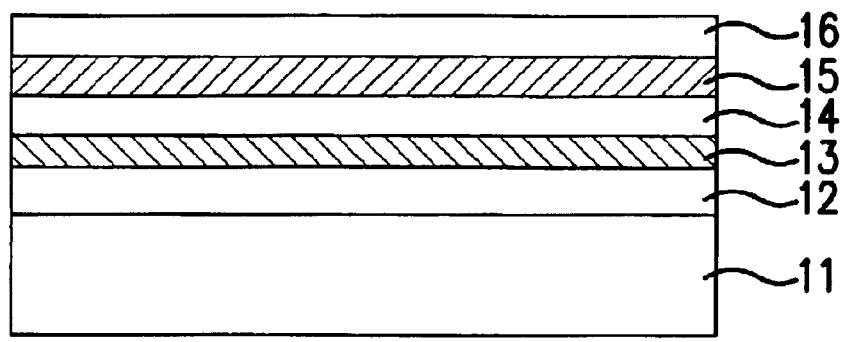
FIG. 1 is a cross-sectional diagram illustrating a conventional method for forming a capacitor of a nonvolatile semiconductor memory device.
Figure 2A:
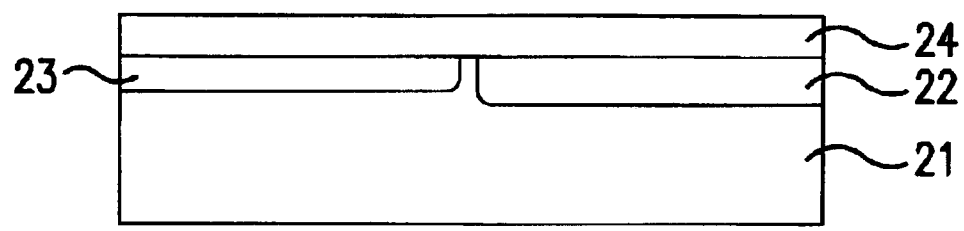
FIGS. 2A through 2F are cross-sectional diagrams illustrating sequential steps of a method for forming a capacitor of a nonvolatile semiconductor memory device in accordance with an embodiment of the present invention.

As illustrated in FIG. 2A, a field oxide film 22 is formed on a semiconductor substrate 21 according to a generally well-known method. A gate electrode (not shown) having a gate insulation film thereunder (not shown) is formed on the semiconductor substrate 21 and the field oxide film 22.

Thereafter, sidewall spacers are formed on the sidewalls of the gate electrode according to a generally well-known method. Junction regions 23 are formed on the semiconductor substrate 21 at both sides of the gate electrode, thereby forming a transistor.

A first interlayer insulation film 24 is formed over the resultant structure, and then planarized according to a chemical mechanical polishing (CMP) process.

Figure 2B:
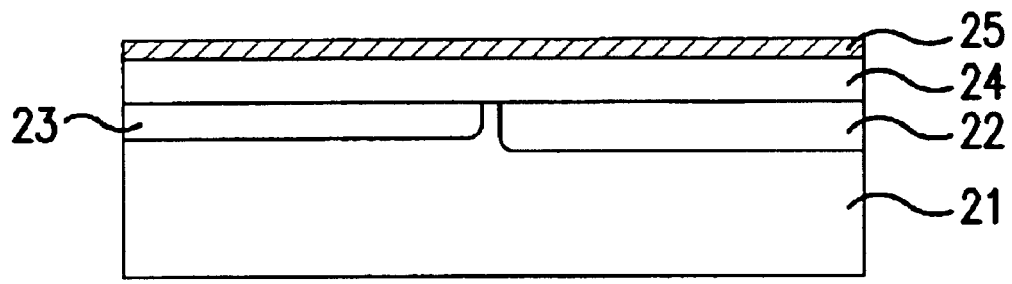

Referring to FIG. 2B, a TaON film 25 for a glue layer is deposited on the first interlayer insulation film 24. Here, the TaON film 25 for the glue layer is formed according to the chemical vapor deposition (CVD) or plasma-enhanced CVD (PE-CVD) process. The TaON film 25 is formed to have a thickness of 50 to 400 Å, by using $Ta(C_2H_5O)_5$ in a chamber maintaining a pressure at 100 mTorr to 10 Torr and receiving $NH_3$ gas. The CVD is performed by maintaining a deposition temperature of 400° C. to 700° C. The PE-CVD is performed by maintaining a deposition temperature of 200° C. to 500° C. and a plasma power of 200W to 1000W.

The TaON film 25 for the glue layer does not deteriorate the capacitor having a peroskate structure with the SBT or SBTN film for the ferroelectric film. In addition, the TaON film 25 for the glue layer has a stabilized structure. Therefore, even when oxidized due to oxygen in a subsequent process, the TaON film 25 for the glue layer includes stable $Ta_2O_5$ compounds. As a result, an interface property of the TaON film 25 is improved due to the stabilized structure and soft surface.

Figure 2C:
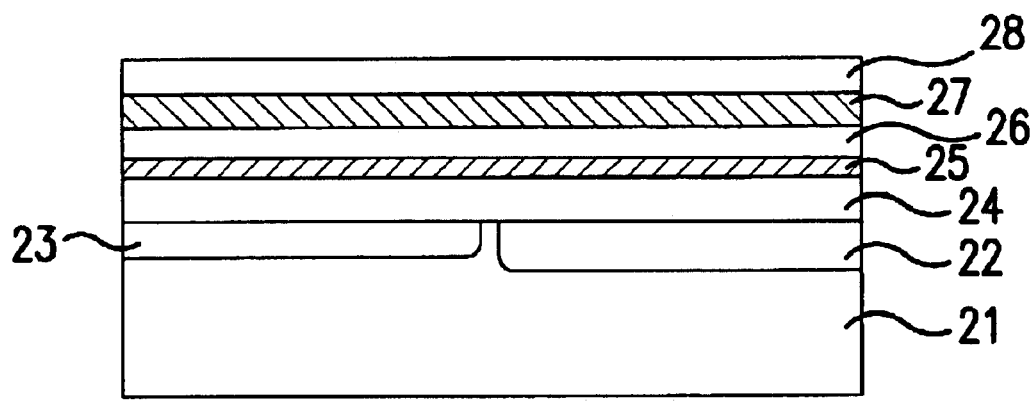

As depicted in FIG. 2C, a metal film 26 for a lower electrode is formed on the TaON film 25. Here, the metal film 26 for the lower electrode consists of Pt, Ir, IrOx, Ru or RuOx film, and is deposited according to the CVD, PE-CVD, physical vapor deposition (PVD), or atomic layer deposition (ALD) process. Preferably, the metal film 26 for the lower electrode is formed to a thickness of 500 to 3000 Å.

Thereafter, an SBT or SBTN film 27 for a ferroelectric film is deposited on the metal film 26. At this time, the SBT or SBTN film 27 for the ferroelectric film is formed by generating cores according to a rapid thermal process (RTP) maintaining 80° C. to 300° C./sec and using $O_2$, $N_2O$ or $O_2+N_2$ gas as a reaction gas. Grain growth is encouraged by a furnace thermal treatment maintaining a temperature of 700 to 850° C. and using $O_2$, $N_2O$ or $O_2+N_2$ gas as a reaction gas.

In addition, the ferroelectric film 27 may be formed according to various deposition methods such as spin-on, PVD sputtering or plasma-enhanced metal organic CVD (PE-MOCVD).

The spin-on method forms the SBT or SBTN film using a liquid material formed by mixing Sr or Bi with octane. Here, n-butyl acetate is employed as a stabilizer for Sr or Bi. A mixed solution of Si and octane is used at an amount of 0.7 to 1.0, and a mixed solution of Bi and octane is used at an amount of 2.05 to 2.5.

On the other hand, the PVD sputtering method deposits a thin ferroelectric film at a normal process temperature to maintain the composition of the film, carries out an RTP thereon, and encourages grain growth according to a subsequent thermal treatment.

The PE-MOCVD method forms the SBT or SBTN film by maintaining a deposition pressure at 5 mTorr to 50 Torr and a temperature at 400 to 700° C.

Returning to FIG. 2C, a metal film 28 for an upper electrode is formed on the SBT or SBTN film 27.

Figure 2D:
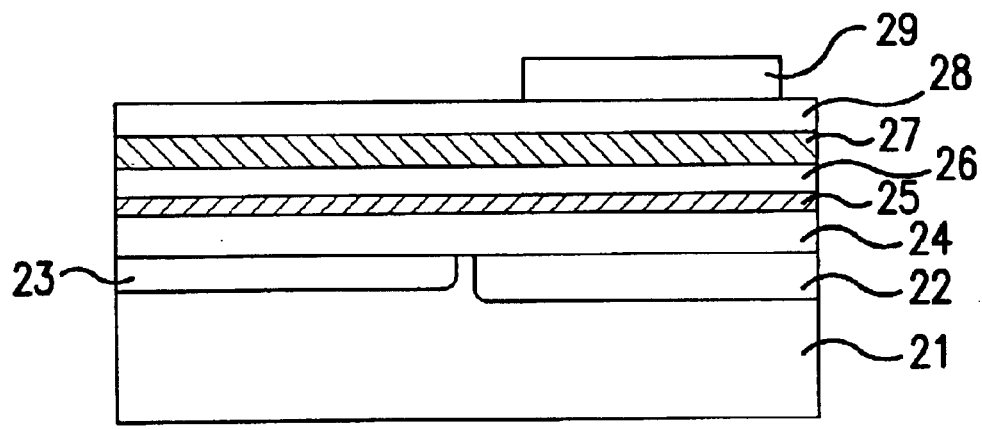

Referring to FIG. 2D, a hard mask film is formed on the metal film 28. A photoresist film pattern (not shown) is formed in a capacitor formation region. The hard mask film is etched by employing the photoresist film pattern as an etch barrier to form a hard mask pattern 29.

Figure 2E:
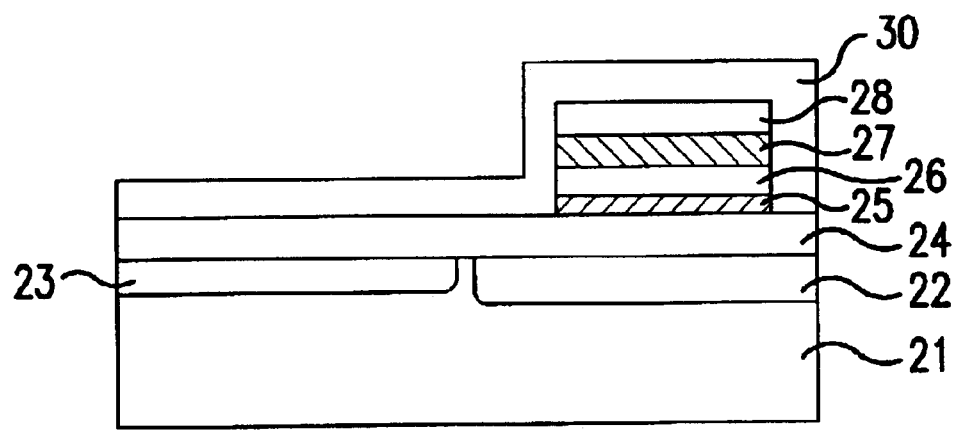

As illustrated in FIG. 2E, the metal film 28, the ferroelectric film 27, the metal film 26, and the TaON film 25 are sequentially etched using the hard mask film 29 as an etch barrier, thereby forming the capacitor. Thereafter, the hard mask film 29 is removed, and a second interlayer insulation film 30 is deposited over the resultant structure.

Figure 2F:
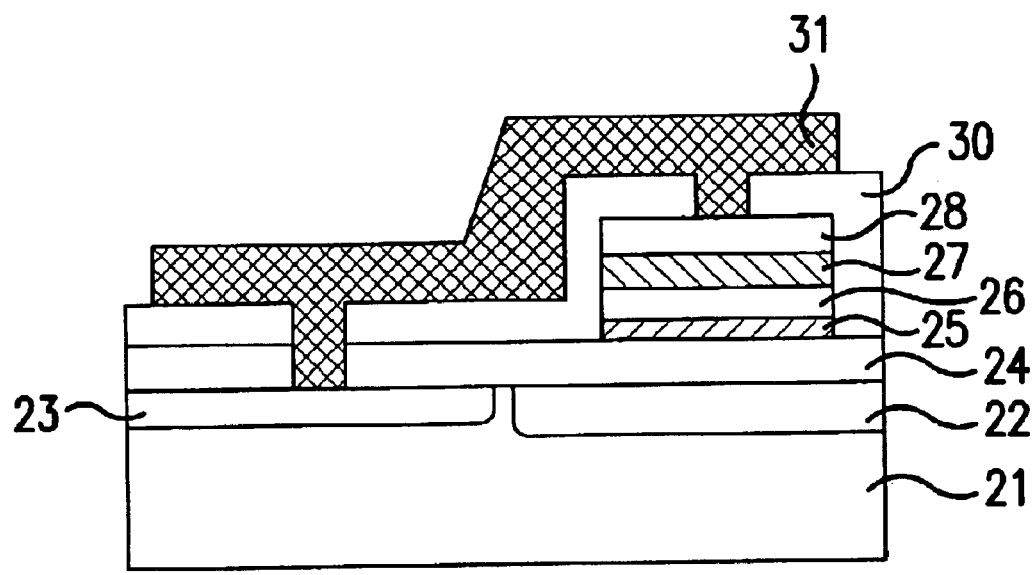

As shown in FIG. 2F, the second interlayer insulation film 30 and the first interlayer insulation film 24 are etched to expose the junction regions 23 and the second interlayer insulation film 24 is, preferably, simultaneously etched to expose the metal film 28. A metal film 31 is deposited to fill up the contact holes created during the etching process, thereby finishing formation of the capacitor of the nonvolatile semiconductor memory device.

As discussed earlier, in accordance with the present invention, the TaON film is used as the glue layer for the lower electrode, and thus does not deteriorate the capacitor composing the peroskate structure of the SBT or SBTN film as the ferroelectric film. In addition, the TaON film has a stabilized structure. Therefore, even when oxidized due to oxygen in a succeeding process, the TaON film includes stable $Ta_2O_5$ compounds. Accordingly, the interface property of the TaON film is improved due to the stabilized structure and soft surface.

As a result, the TaON film is used as the glue layer for the lower electrode of the capacitor, thereby improving the contact property, restricting interface lifting, and improving the electrical property.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A method for forming a capacitor of a nonvolatile semiconductor memory device, comprising the steps of:

forming a TaON glue layer over a semiconductor substrate;

forming a lower electrode on the TaON glue layer;

forming an SBT or SBTN film for a ferroelectric film on the lower electrode; and forming an upper electrode on the ferroelectric film, wherein the SBT or SBTN film for the ferroelectric film is formed by generating cores according to a rapid thermal process maintaining 80° C. to 300° C./sec and using $O_2$, $N_2O$ or $O_2+N_2$ gas as a reaction gas, and by encouraging grain growth according to a furnace thermal treatment maintaining a temperature at 700 to 850° C. and using $O_2$, $N_2O$ or $O_2+N_2$ gas as a reaction gas.

2. The method according to claim 1, wherein the TaON film glue layer is formed by using a CVD, PE-CVD, PVD or ALD method.

3. The method according to claim 2, wherein the CVD is performed at a deposition temperature of 400 to 700°C.

4. The method according to claim 2, wherein the PE-CVD is performed by maintaining a deposition temperature of 200 to 500°C. and a plasma power of 200 to 1000W.

5. The method according to claim 1, wherein the TaON film glue layer is formed to have a thickness of 50 to 400 Å, by using $Ta(C_2H_5O)_5$ in a chamber maintaining a pressure at 100 mTorr to 10 Torr and receiving $NH_3$ gas.

6. The method according to claim 1, wherein the lower electrode is formed according to a CVD, PE-CVD, PVD or ALD process.

7. The method according to claim 1, wherein the lower electrode includes Pt, Ir, IrOx, Ru or RuOx film.

8. The method according to claim 1, wherein the lower electrode is formed to a thickness of 500 to 3000 Å.

9. The method according to claim 1, wherein the SBT or SBTN film for the ferroelectric film is formed using one of a spin-on, PVD sputtering and PE-MOCVD method.

10. The method according to claim 9, wherein the spin-on method forms the SBT or SBTN film using a liquid material formed by mixing Sr or Bi with octane, and using n-butyl acetate as a stabilizer for the Sr or Bi.

11. The method according to claim 10, wherein a mixed solution of Si and octane is used at an amount of 0.7 to 1.0.

12. The method according to claim 10, wherein a mixed solution of Bi and octane is used at an amount of 2.05 to 2.5.

13. The method according to claim 9, wherein the PVD sputtering method deposits the SBT or SBTN film at a temperature to maintain a composition of the SBT or SBTN film, carries out a rapid thermal process and encourages grain growth by performing a thermal treatment.

14. The method according to claim 9, wherein the PE-MOCVD forms the SBT or SBTN film by maintaining a deposition pressure at 5 mTorr to 50 Torr and a temperature of 400 to 700°C.

15. The method according to claim 1, further comprising:

forming an interlayer insulation film over the substrate; and wherein the forming the TaON glue layer step forms the TaON glue layer on the interlayer insulation film.

16. The method according to claim 1, further comprising:

forming an interlayer insulation film over the substrate, the interlayer insulation film having a contact hole exposing the upper electrode; and forming a metal film in the contact hole.

* * * * *